United States Patent [19]
Chu et al.

[11] Patent Number: 5,777,504
[45] Date of Patent: Jul. 7, 1998

[54] COUPLE NOISE PROTECTION CIRCUIT TECHNIQUE

[75] Inventors: Albert M. Chu, Essex Junction; Ronald A. Piro, Williston, both of Vt.

[73] Assignee: International Business Machines Corporation, Armonk, N.Y.

[21] Appl. No.: 735,774

[22] Filed: Oct. 23, 1996

[51] Int. Cl.$^6$ ............................ H03K 5/00; H03B 1/04
[52] U.S. Cl. ..................... 327/379; 327/310; 327/208; 327/538; 327/311
[58] Field of Search ................................ 327/199, 200, 327/208, 214, 225, 310, 311, 379, 551, 109, 538

[56] References Cited

U.S. PATENT DOCUMENTS

| | | |
|---|---|---|
| 4,698,529 | 10/1987 | Asami ........................... 327/310 |
| 5,272,674 | 12/1993 | Pathak et al. ................ 327/310 |
| 5,440,257 | 8/1995 | Kawashima .................. 327/100 |
| 5,481,213 | 1/1996 | Johnson ........................ 327/100 |
| 5,508,643 | 4/1996 | Khieu ............................ 327/51 |

*Primary Examiner*—Timothy P. Callahan
*Assistant Examiner*—Dinh Le
*Attorney, Agent, or Firm*—Schmeiser, Olsen & Watts; Eugene I. Shkurko

[57] ABSTRACT

Disclosed is a novel circuit technique that will significantly improve the noise margin of a passgate latch design. The circuit technique consists of a passgate latch with additional circuitry for sensing the occurrence of coupled noise and then turning on a current mirror that injects current into the latch internal node to stabilize the latch. The circuit further includes a disabling system for disabling the additional circuitry during normal operation of the passgate latch.

18 Claims, 3 Drawing Sheets

COUPLE NOISE PROTECTION CIRCUIT TECHNIQUE

BACKGROUND OF THE INVENTION

1. Technical Field

The present invention relates to circuits and more particularly to a circuit for improving the noise margin on a passgate latch design.

2. Related Art

The unbuffered latch has become a critical and often used component in today's high performance circuit designs. Unbuffered latches, such as passgate latches, allow data to be transferred at a high rate of speed between circuit components where timing is critical. However, because unbuffered latches must handle data without the benefit of an "isolating circuit" for preventing undesirable interactions, unwanted side-effects may often occur. In particular, when a quiet line is driving the data input of an unbuffered passgate latch, a coupled noise pulse could flip the latch state. This is the result of capacitive coupling among signal wires. The problem is particularly prone in deep sub-micron integrated circuits (IC's) where quiet signal wires are often surrounded by switching wires.

FIG. 1 illustrates this problem. Shown is a simplified schematic of a conventional CMOS latch with an NFET passgate. When the initial conditions of the latch state are at "1" (i.e., node PL1 at VDD), the clock "CLK" is inactive at ground, and the "D" data input is also at ground, a capacitive coupling problem potentially exists. In particular, if the "D" input pin is connected to a net (not shown) where adjacent switching wires are coupling noise, the latch state could inadvertently switch. When the "nearby" switching wires go from high to low, a negative voltage may be coupled onto the quiet wire resulting in a positive Vgs on the NFET passgate (N3) thereby turning on the NFET to discharge the latch node (PL1). When a large enough negative pulse is coupled into the "D" input, the state of the latch will be switched.

This problem has been traditionally solved by buffering the data input port of the latch through an inverter circuit. Unfortunately, this causes a performance penalty of two inverter stages plus additional power consumption.

Thus, without an improved circuit technique for eliminating circuit noise for unbuffered latches, the ability to use such devices in high performance designs will be limited. The aforementioned technology references and prior art are herein included by reference.

SUMMARY OF THE INVENTION

The present invention provides an apparatus for eliminating coupling noise in a bistable logic device, such as an unbuffered passgate latch. In particular, the apparatus comprises a noise sensing system coupled to an input line of the bistable logic device, a stabilizing system coupled to both the noise sensing system and the input line for maintaining a constant state at the input line, and a deactivation system coupled to both the stabilizing system and the bistable logic device for deactivating the stabilizing system when its use is not required. More particularly, the present invention addresses an unbuffered latch having a passgate coupled to its input. The new latch circuit includes a current mirror coupled to an input and output of the passgate, along with a noise sensing transistor at the input. In addition, the latch includes a deactivating transistor coupled between the noise sensing system and the current mirror for disabling both when the problem of noise coupling is not likely to occur.

In accordance with the above, it is an advantage of the present invention to improve the noise margin of a passgate latch design.

In accordance with the above, it is a further advantage of the present invention to eliminate capacitive coupling in an unbuffered latch circuit.

In accordance with the above, it is a further advantage of the present invention to eliminate capacitive coupling in an unbuffered latch circuit without using two or more invertors and additional power consumption.

The foregoing and other objections, features and advantages of the invention will be more apparent from the following more particular description of the preferred embodiments of the invention as illustrated in the accompanying drawings.

BRIEF DESCRIPTION OF THE DRAWINGS

The preferred exemplary embodiment of the present invention will hereinafter be described in conjunction with the appended drawings, where like designations denote like elements and.

BEST MODE FOR CARRYING OUT THE INVENTION

Figure 1:
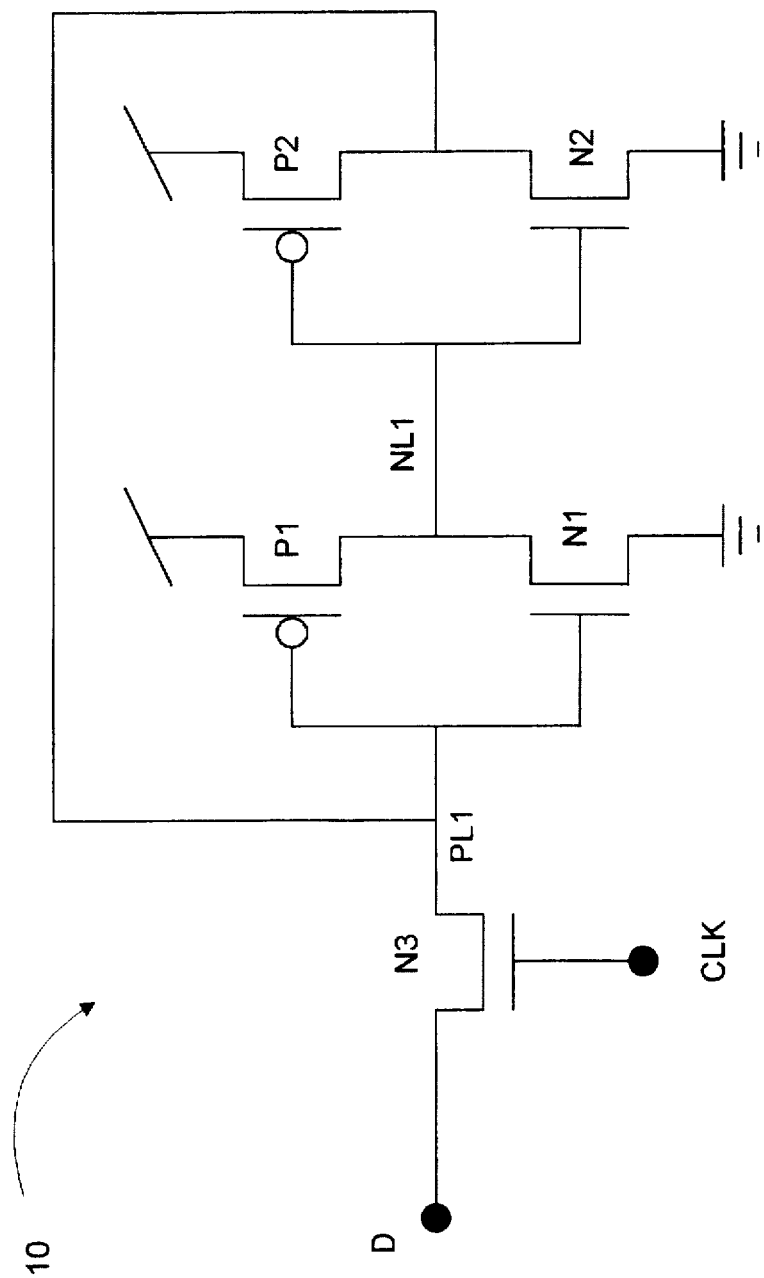
FIG. 1 depicts a circuit diagram of an unbuffered NFET passgate latch design.

Referring now to the drawings, FIG. 1 depicts an unbuffered NFET passgate latch 10 that is susceptible to capacitive coupling. The circuit includes an input "D" and a clock input CLK, both of which are inputted into an NFET N3 that acts as a passgate. The latch further includes two NFET/PFET transistor pairs P1, N1 and P2, N2. The latch is typically used to "hold" data (i.e., a 1 or a 0) at nodes PL1 and NL1. As noted above, under certain circumstances, passgate N3 might discharge node PL1, thereby changing the state of the latch when a large enough negative pulse is coupled into the input D.

Figure 2:
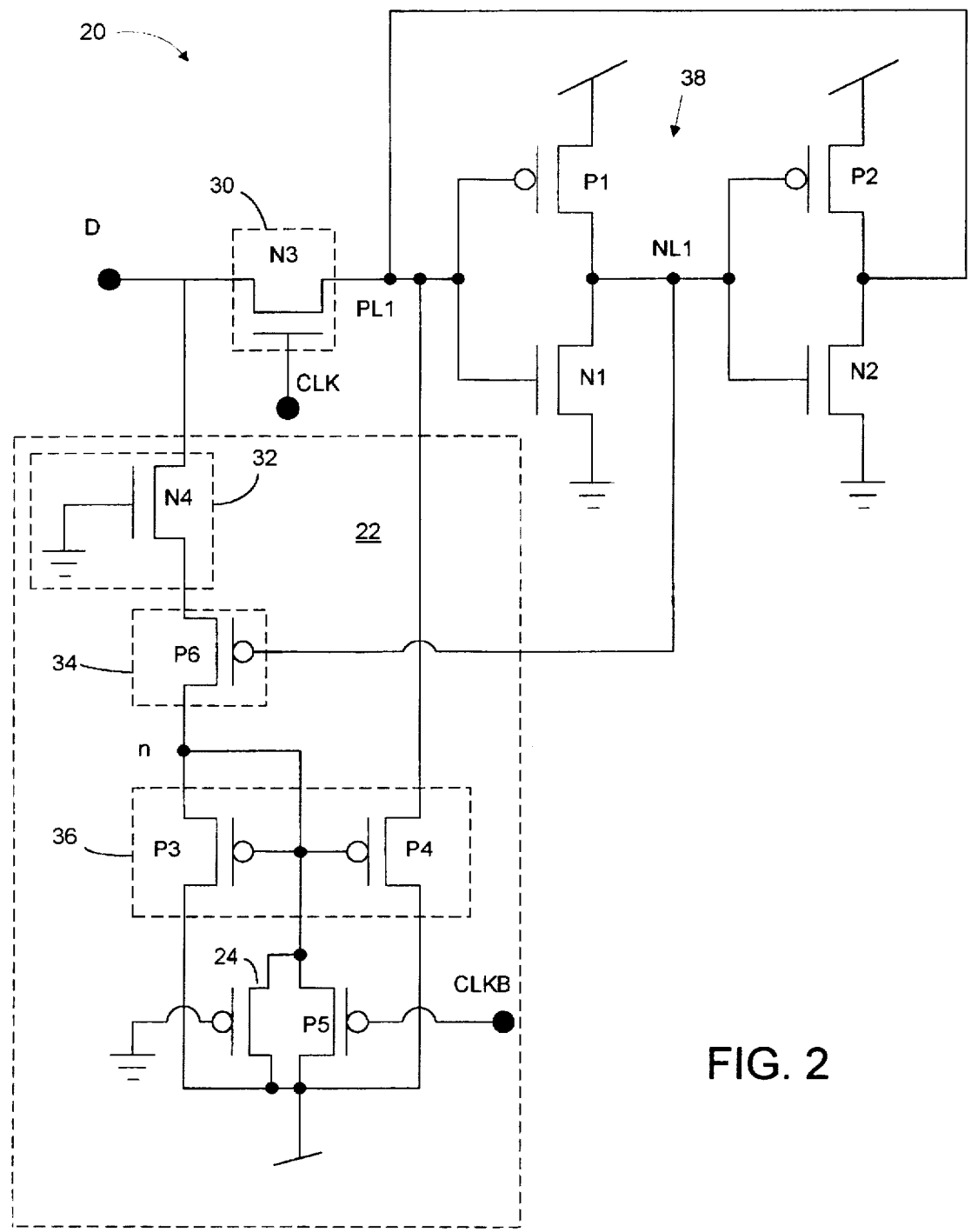
FIG. 2 depicts a circuit diagram of the latch shown in FIG. 1 with additional circuitry in accordance with a preferred embodiment of the present invention.

FIG. 2 depicts a circuit 20 that shows a passgate latch (comprised of two NFET/PFET transistor pairs 38, along with a pass gate 30 that receives a clock input CLK) with additional circuitry 22 attached thereto to protect against capacitive coupling. The added circuitry 22 includes a noise sensing device 32, a stabilization device 36, and a deactivation device 34. In particular, the added circuitry 22 includes devices N4, P3, P4, P5 and P6 which protect against noise coupling in the passgate latch. Device N4 is a sensing circuit, devices P3 and P4 form a current mirror, device P5 is used to disable the current mirror during normal operation as well as precharging node n to VDD, and device P6 shuts off the circuit structure when the latch is at a 0 state (i.e., node PL1 is at ground "gnd"). All of the added devices in circuitry 22 can be relatively small except for P4 which needs to be big enough (e.g., 10 to 20 μm) to source current into node PL1.

As the data input D is being coupled to a negative voltage, the device N4 (the sensing means) will turn on and source a current into node D. This current will flow through device P3, thus turning on device P4 which will source a current into node PL1 as needed to stabilize the latch state. The current mirror will be disabled during normal operation by device P5, which will also act to precharge node n to VDD. Device P5 includes a clock input CLKB as an input for controlling the stabilization device 36. Device P6 will shut off the entire circuit structure when the latch is at a "0" state (i.e., PL1 at gnd). A small PFET 24 with a gate tied to ground is included to act as a bleeder circuit to eliminate possible floating of node n.

Figure 3:
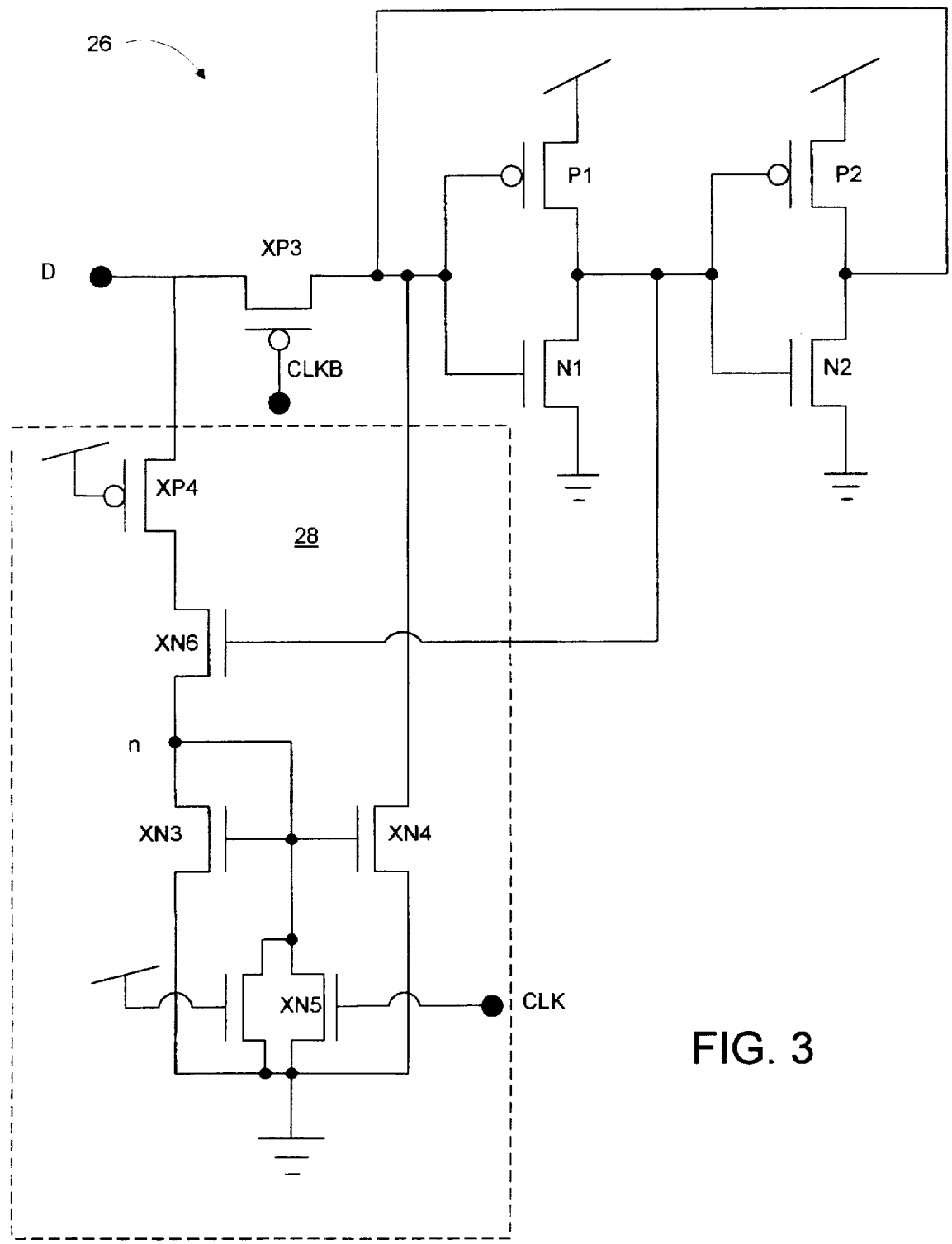
FIG. 3 depicts a circuit diagram of a PFET passgate latch design in accordance with a preferred embodiment of the present invention.

Referring now to FIG. 3, a similar circuit 26 is shown for protecting a PFET passgate using a compliment of the devices described above. The latch circuit 26 of FIG. 3 includes a PFET passgate XP3. The additional circuitry 28 utilized to protect against noise coupling includes detecting means XP4, a stabilizing system made up of a current mirror with XN3 and XN4, and a deactivation system made up of PFET XN6. The operation of the circuit 26 shown in FIG. 3 is functionally analogous to the circuit shown in FIG. 2.

While the invention has been particularly shown and described with reference for few preferred exemplary embodiments thereof it will be understood by those skilled in the art that various changes in form and details may be made therein without departing from the spirit and the scope of the invention.

We claim:

1. Apparatus for eliminating coupling noise in a bistable logic device, said apparatus comprising:

a noise sensing device coupled to an input line of said bistable logic device;

a stabilizing device coupled to said noise sensing device and to said input line, said stabilizing device for maintaining a constant state at said input line; and a deactivation device coupled to said stabilizing device and said bistable logic device, said deactivation device for deactivating said stabilizing device.

2. The apparatus of claim 1 wherein said bistable logic device is an unbuffered latch with a passgate coupled to its input.

3. The apparatus of claim 1 wherein said noise sensing device includes a field effect transistor.

4. The apparatus of claim 2 wherein said stabilizing device includes a current mirror coupled to an input and an output of said passgate.

5. The apparatus of claim 1 wherein said deactivation device is coupled between said noise sensing device and said stabilizing device.

6. The apparatus of claim 1 wherein said stabilizing device further includes a bleeder circuit.

7. An unbuffered latch circuit comprising:

a passgate coupled to an input of said unbuffered latch circuit, said passgate having an input for receiving data;

a noise sensing circuit coupled to said input of said passgate;

a current mirror coupled to said noise sensing circuit and to an output of said passgate; and a disabling circuit coupled to said current mirror and to said unbuffered latch circuit.

8. The unbuffered latch of claim 7 wherein said unbuffered latch circuit is an NFET passgate latch.

9. The unbuffered latch of claim 7 wherein said unbuffered latch circuit is a PFET passgate latch.

10. The unbuffered latch of claim 7 wherein said unbuffered latch is a combination PFET/NFET latch.

11. The unbuffered latch of claim 7 wherein said passgate further includes a clock input.

12. The unbuffered latch of claim 7 wherein said current mirror includes an input coupled to said noise sensing circuit and an output coupled to said output of said passgate.

13. The unbuffered latch of claim 7 wherein said current mirror includes a clock input.

14. The unbuffered latch of claim 7 wherein said current mirror includes a bleeder circuit.

15. An apparatus comprising:

detecting means coupled to an input line of a passgate on a bistable logic device for detecting noise on said input line;

stabilizing means coupled to said detecting means and to an output line of said passgate for counteracting the noise on said input line in response to said detecting means detecting noise on said input line; and deactivating means coupled to the bistable logic device and to said correcting means for deactivating the detecting means and the correcting means in response to a state of the bistable logic device which does not require noise protection.

16. The apparatus of claim 15 wherein said stabilizing means includes means for injecting a current to said output of said passgate.

17. The apparatus of claim 15 wherein said bistable logic device is an NFET passgate latch.

18. The apparatus of claim 15 wherein said bistable logic device is a PFET passgate latch.

* * * * *